United States Patent [19]

Nakane et al.

[11] Patent Number: 4,590,149

[45] Date of Patent: May 20, 1986

[54] METHOD FOR FINE PATTERN FORMATION ON A PHOTORESIST

[75] Inventors: Hisashi Nakane, Kawasaki; Akira Yokota, Yamato; Mitsuo Yabuta, Samukawa; Minoru Tsuda, Isehara; Wataru Ishii, Hadano, all of Japan

[73] Assignee: Tokyo Ohka Kogyo Co., Ltd., Kawasaki, Japan

[21] Appl. No.: 672,763

[22] Filed: Nov. 19, 1984

[30] Foreign Application Priority Data

Nov. 28, 1983 [JP] Japan ................. 58-221985

[51] Int. Cl.$^4$ ................. G03F 7/26
[52] U.S. Cl. ................. 430/325; 430/197; 430/296; 430/330; 430/967
[58] Field of Search .......... 430/323, 330, 325, 296, 430/197, 326, 967

[56] References Cited

U.S. PATENT DOCUMENTS

| | | | |
|---|---|---|---|
| 4,015,986 | 4/1977 | Paal et al. | 430/330 |
| 4,241,165 | 12/1980 | Hughes et al. | 430/330 |
| 4,292,384 | 9/1981 | Stroughan et al. | 430/323 |
| 4,307,176 | 12/1981 | Mochiji et al. | 430/330 |
| 4,388,397 | 6/1983 | Kanai | 430/197 |
| 4,401,745 | 8/1983 | Nokane et al. | 430/197 |
| 4,433,044 | 2/1984 | Meyer et al. | 430/323 |
| 4,439,516 | 3/1984 | Cernigliaro et al. | 430/323 |
| 4,465,768 | 8/1984 | Ueno et al. | 430/197 |
| 4,540,650 | 9/1985 | Klug et al. | 430/330 |
| 4,547,455 | 10/1985 | Hiramoto et al. | 430/330 |
| 4,551,409 | 11/1985 | Gulla et al. | 430/197 |

OTHER PUBLICATIONS

Walker, E. J., *IEEE Transactions on Electron Devices*, vol. ed-22, No. 7, 7/1975.

*Primary Examiner*—Charles L. Bowers, Jr.
*Attorney, Agent, or Firm*—Armstrong, Nikaido, Marmelstein & Kubovcik

[57] ABSTRACT

A method for high-fidelity fine patterning of a photoresist layer involving a dry-process development by exposure to a plasma gas. Following irradiation in a pattern with actinic rays, a photoresist layer coated on a substrate is heated in an atmosphere at 200° to 500° C. Subsequent exposure of the photoresist layer to a plasma gas gives a finely patterned resist layer with a very high residual film ratio or very small decrease in the film thickness.

1 Claim, No Drawings

METHOD FOR FINE PATTERN FORMATION ON A PHOTORESIST

BACKGROUND OF THE INVENTION

The present invention relates to a method for forming a finely patterned photoresist layer on a substrate or, more particularly, to a method for forming a finely patterned photoresist layer on a substrate in which a layer of the photoresist material is subjected to irradiation in a pattern with actinic rays followed by a dry-process development through exposure to an atmosphere of a plasma gas.

As is well known, the manufacture of semiconductor devices in the semiconductor industry is performed in a number of processing steps, typically including photolithography. The photolithography step is usually performed by use of a photoresist material which is a type of photosensitive composition. In a typical process of photolithography, a silicon wafer is first provided with a thin undercoating film of several hundred nanometers in thickness of aluminum, silicon oxide, silicon nitride, polysilicon and similar material, and then with a coating layer of a photoresist composition. The photoresist layer is then irradiated in a pattern with actinic rays such as ultraviolet light through a photomask having a desired pattern, followed by development with a suitable developer liquid or solution to give a patterned layer of the photoresist. This patterned layer serves as a protective mask for the thin undercoating film in a subsequent etching step whereby the thin undercoating film in the unprotected areas is removed, exposing the substrate surface. Finally, the patterned layer of photoresist is removed to expose the layer of thin undercoating which had not been etched and remains in a pattern corresponding to the photomask pattern.

The above described process of photolithography includes as an essential step development by a wet process using a developer liquid. A problem in wet process development is that the film of photoresist in the areas where the photoresist is not to be removed absorbs the developer liquid and becomes swollen so that the method is not quite satisfactory or practical when the pattern of the photoresist layer formed on the substrate is extremely fine. In addition, the developer liquid which usually is or contains an organic solvent causes serious problems related not only to workers' health but also to environmental pollution.

Accordingly, as a trend in recent years, the wet-process development method which has the inherent problems and disadvantages described above is being replaced by the so-called dry-process development method. In dry-process development, the photoresist layer on the substrate surface is first irradiated in a pattern with actinic rays. It is then subjected to a treatment so as to produce a difference between the irradiated and unirradiated areas of the photoresist layer in its resistance to forming ash when exposed to an atmosphere of a plasma gas. The areas of the photoresist layer where the photoresist layer has less resistance against the plasma gas is thereby removed upon ashing, leaving a patterned layer of the resistant photoresist composition on the substrate surface. Because no developer liquid is used at all, dry-process development is very advantageous when a very fine pattern of the photoresist layer is desired. In addition, problems associated with workers' health and environmental pollution are avoided so that this method is highly valued in the modern semiconductor industry.

Dry-process development hitherto reported includes a method described in Japanese Patents Kokai 57-44143 and 58-60537 according to which the resist layer is irradiated in a pattern with actinic rays, and then subjected to heat treatment in an atmosphere at a temperature in the range from 80° to 180° C. to produce a difference between the irradiated and unirradiated areas in the resistance of the resist layer against the plasma, followed by development by exposure to an atmosphere of a plasma gas.

In the above described method, the upper limit of the temperature for the heat treatment is usually 180° C. because it has been generally understood that the resist layer may be softened and flow when the temperature of the heat treatment exceeds 200° C. Heat treatment at this relatively low temperature takes a relatively long time. Therefore, the substrate such as a silicon wafer is sometimes badly affected. For example, it may become warped as a result of such a prolonged heat treatment. Moreover, the low temperature of the heat treatment can produce only an insufficient difference between the irradiated and unirradiated areas in the resistance of the resist layer against the plasma gas. Accordingly, the residual film thickness of the patterned resist layer formed in this manner is undesirably small, and the method is not suitable for practical use in the formation of a finely patterned resist layer.

SUMMARY OF THE INVENTION

An object of the present invention is therefore to provide an improved method for forming a finely patterned photoresist layer including a dry process that is free from the problems and disadvantages associated with the prior art methods and described above.

The method of this invention for finely patterning a photoresist layer was established as a result of extensive investigations conducted by the inventors. Such method comprises the steps of: irradiating in a pattern with actinic rays a photoresist layer formed on a substrate; heating the photoresist layer in an atmosphere kept at a temperature in the range from 200° to 500° C. for a length of time not exceeding 10 minutes; and exposing the thus heat-treated photoresist layer on the substrate surface to an atmosphere of a plasma gas so as to decompose and remove from the surface of the substrate the photoresist layer in the areas not irradiated with the actinic rays.

DETAILED DESCRIPTION OF THE PREFERRED EMBODIMENTS

The photoresist material used in the inventive method may be any one of the negative-type photoresist compositions conventionally used in photolithography. A preferable photoresist material is a composition comprising a polymer and an aromatic azide compound. The polymer should have such properties that the layer of the photoresist formed on the surface of a substrate has no surface tackiness, and that the layer of photoresist material can readily be decomposed and removed when it is exposed to an atmosphere of a plasma gas. Several examples of preferable polymers include polymethyl methacrylate, poly(methyl isopropenyl ketone), poly(glycidyl methacrylate), poly(glycidyl acrylate), copolymers of glycidyl methacrylate and methyl methacrylate, polyvinyl chloride, polyvinyl acetate, copolymers of vinyl chloride and vinyl acetate, colypolymers of vinyl chloride and acrylic acid, poly(isopropyl vinyl ketone, poly butyl-methacrylate, poly(2,3-dichloro-1-propyl acrylate), poly(1,3-dichloro-1-propyl acrylate), and poly(2-chloroethyl acrylate).

The aromatic azide compound to be combined with the above named polymer is preferably selected from the compounds represented by the general formula $N_3-A-X-A-N_3$, in which A is a divalent aromatic hydrocarbon group selected from the class consisting of 1,4-phenylene, 1,4-naphthylene and the anthracene group of the formula

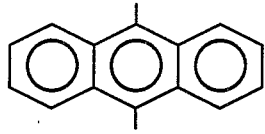

and X is a divalent group selected from the class of the groups expressed by the formulas of $-CH=CH-CO-$, $-CH=CR^1-CO-CR^1=CH-$, $-CH=CH-CH=CR^1-CO-CR^1=CH-CH=CH-$,

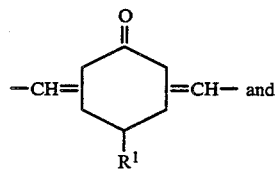

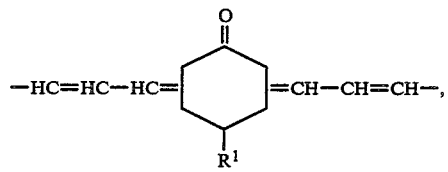

$R^1$ in the above formulas being independently selected from the class consisting of a hydrogen atom, alkyl group having from 1 to 3 carbon atoms, cyano group, phenyl group and phenoxy group.

Several examples of such an aromatic azide compound include 4,4'-diazidochalcone, 4,4'-diazidodibenzylidene acetone, 2,6-di(4-azidobenzylidene cyclohexanone,
2,6-di(4-azidobenzylidene)-4-methylcyclohexanone,
2,6-di(4-azidocinanamylidene)cyclohexanone,
4,4'-diazidodicinnamylidene acetone, and
2-(-4-azidobenzylidene)-4-(phenoxy-6-(4-azidobenzylidene)cyclohexanone.

The photoresist coating solution containing the above mentioned polymer and the aromatic azide compound can be prepared by dissolving these compounds in one, or a mixture, of the solvents such as cyclohexanone, ethyleneglycol monoethyl ether acetate, ethyleneglycol monomethyl ether acetate, chlorobenzene, toluene, tetrahydrofuran and the like.

To form a photoresist layer of a desired thickness on the surface of a substrate such as a silicon wafer, the thus prepared solution is diluted to an appropriate concentration. The diluted coating solution is applied to the substrate surface by use of a spinner, although the coating method is not limited thereto. Any known method is applicable to the formation of the photoresist layer. The substrate, wet with the coating solution, should be dried, by conventional means, such as heating in a hot air oven, to evaporate and remove the solvent from the coating layer so as to form a solid photoresist layer on the substrate surface. The photoresist layer thus formed on the substrate surface is then irradiated in a pattern with actinic rays according to a conventional procedure. The type of actinic rays usable in this case are either corpuscular beams or electromagnetic waves, exemplified by electron beams and ion beams for the former and by X-rays, ultraviolet light and far ultraviolet light for the latter.

Next, the photoresist layer on the substrate surface is subjected to heat treatment, in an atmosphere, at a temperature in the range from 200° to 500° C., for a length of time not exceeding 10 minutes. Such a heat treatment can be performed without particular difficulties by putting the substrate bearing the photoresist layer into a hot air oven kept and controlled in advance at a desired temperature in the range from 200° to 500° C. Although the length of time of the heat treatment should be properly selected depending on various parameters such as the temperature of the heat treatment, type of the photosensitive composition and other parameters, it is usually 10 minutes or shorter. For example, the length of heat treatment should be about 10 minutes when the temperature is 200° C., while the heat treatment may be complete within about 1 second when the temperature is 500° C. When the temperature is lower than 200° C., the photoresist layer on the areas irradiated with actinic rays is not imparted with sufficiently high resistance against the plasma gas in the subsequent dry-process development, so that the residual film ratio of the patterned resist layer is low. On the other hand, when the temperature is higher than 500° C. or the heat treatment is prolonged over 10 minutes, the developability of the photoresist layer is decreased, consequently resulting in low fidelity of the pattern reproduction.

The photoresist layer on the substrate surface after the irradiation in a pattern with actinic rays and heat treatment in the above described manner is then exposed to an atmosphere of a plasma gas in an atmosphere for plasma treatment, so that the photoresist layer in the areas unirradiated with the actinic rays is selectively decomposed and removed from the surface of the substrate to leave a patterned layer of the photoresist. Gases suitable for use in the plasma chamber for the dry-process development of this invention are exemplified by, but not limited to, oxygen, carbon tetrafluoride, and mixtures of oxygen with carbon tetrafluoride or argon.

In the inventive method, the aromatic azide compound in the photoresist layer in the areas selectively irradiated with the actinic rays is activated and reacts with the polymer in the photoresist composition to cause crosslinking. The thus crosslinked aromatic azide compound and the polymer are rearranged by the subsequent heat treatment in a heated atmosphere of 200° to 500° C. for 10 minutes or less, to produce a structure capable of deactivating the excitation energy imparted from the plasma gas. As a result, the resistance of the photoresist layer against the plasma gas is greatly increased so that the velocity of ashing by the plasma treatment is greatly decreased in the irradiated areas of the photoresist layer. On the other hand, the heat treatment has the effect of deactivating the aromatic azide compound in the photoresist layer in the areas unirradiated. Thus, a large difference is produced in the resistance of the photoresist layer against the plasma gas between the irradiated and unirradiated areas. The photoresist layer on the unirradiated areas is rapidly ashed and selectively removed from the substrate surface by the plasma treatment, while the photoresist layer in the irradiated areas is insignificantly attacked by the plasma gas, and is left on the substrate surface to form a finely patterned photoresist layer with a remarkably large residual film ratio or small decrease in the thickness of the photoresist layer.

The most characteristic feature of the inventive method is in the outstanding high temperature of 200° to 500° C. used for the heat treatment of the photoresist layer following its irradiation. The heating temperature is much higher than that utilized in conventional methods, so that a much larger difference is produced in the resistance of the photoresist layer against the plasma gas between the irradiated and unirradiated areas. This large difference contributes to the enhancement of the fineness and fidelity of pattern reproduction, as well as enhancement of the residual film ratio of the patterned photoresist layer. Further, the method has no adverse influence on the substrate owing to the relatively short time of the heat treatment so that great advantages are obtained when the method is applied to photolithography using dry-process development.

In the following, the method of the invention is described in more detail by way of examples.

EXAMPLE 1

A photosensitive composition in the form of solution was prepared by dissolving 10 g of a poly(methyl isopropenyl ketone) having an average molecular weight of about 200,000 and 3 g of 2,6-di(4-azidobenzal)-4-methyl cyclohexanone in about 90 g of cyclohexanone. The solution was applied to a silicon wafer on a spinner rotating at 3000 rpm for 30 seconds, followed by drying for 20 minutes in a hot air oven kept at 85° C. to evaporate the solvent in the coating film. The thus formed photoresist layer was then subjected to a 4-count hard-contact exposure in a pattern to far ultraviolet light on an apparatus for ultraviolet exposure Model PLA-520 F, manufactured by Canon Co. equipped with a cold mirror (Model CM-290) through a photomask used for testing of resolving power and having a line pattern of 0.5 μm width at the finest point. Three silicon wafers were processed in the same manner as described above and subsequently heat-treated in a baking oven under three different conditions, respectively: (1) treatment for 10 minutes in an atmosphere at 200° C., (2) treatment for 1 second in an atmosphere at 500° C. and (3) treatment for 3 minutes in an atmosphere at 140° C. for comparative purpose.

Thereafter, each of the thus heat-treated silicon wafers was subjected to dry-process development by exposure to an atmosphere of oxygen gas plasma for 60 seconds on a table kept at a temperature of 105° C. in an apparatus for plasma treatment (Model OAPM-300, manufactured by Tokyo Ohka Kogyo Co.) in which the oxygen gas plasma was generated by applying a RF output of 25 watts at a frequency of 13.56 MHz with the oxygen gas flowing at a rate of 200 ml/minute under a pressure of 1.0 Torr. The results were that a high-fidelity reproduction of the test pattern having a finest line width of 0.5 μm could be obtained in the patterned photoresist layer on each of the three silicon wafers. The residual film ratio of the patterned photoresist layer was 90% on the first and second of the silicon wafers and 80% on the third.

EXAMPLE 2

Essentially the same experimental procedure as in Example 1 above was repeated with three silicon wafers, except that the coating solution of the photosensitive composition was prepared by dissolving 10 g of a poly(methyl methacrylate) having an average molecular weight of about 600,000 and 3 g of 4,4'-diazidochalcone in about 90 g of ethyleneglycol monoethyl ether acetate. The results were substantially the same as in the preceding example.

EXAMPLE 3

A coating solution of the photosensitive composition was prepared by dissolving 5 g of a copolymer of vinyl chloride and vinyl acetate having an average molecular weight of about 100,000 and 1 g of 4,4'-diazidodibenzylidene acetone in about 50 g of toluene. A silicon wafer was coated with the solution on a spinner rotating at 3000 rpm for 30 seconds, followed by drying for 20 minutes in a hot air oven kept at 85° C. to evaporate and remove the residual solvent in the coating film. Three silicon wafers were processed in the same way as described above.

The thus formed photoresist layer on each of the silicon wafers was then irradiated in a spot pattern with electron beams for 30 seconds in a scanning electron microscope (Model HHS-2R, manufactured by Hitachi Ltd.) operating with an electron beam current of $5 \times 10^{-10}$ A to give an irradiation intensity of $9.62 \times 10^{-6}$ C/cm². The thus electron beam-irradiated silicon wafers were subjected to heat treatment in a baking oven under three different conditions in the same manner as in Example 1, followed by dry-process development in a plasma atmosphere also in the same manner as in Example 1. The results were that the residual film ratio was 90% on the first and second silicon wafers heat-treated at 200° C. and 500° C., respectively, while the value was 80% on the third silicon wafer treated at 140° C.

EXAMPLE 4

The experimental procedure was the same as in Example 1 except that the heat treatment following the exposure in a pattern of the photoresist layer to ultraviolet was performed at 300° C. for 1 minute or at 400° C. for 30 seconds. The results were that the residual film ratio was 90% in each case.

What is claimed:

1. A method for finely patterning a photoresist layer on a substrate which comprises the steps of:
   (a) forming a layer of a negative photoresist composition comprising polymer and aromatic azide compound on a surface of a substrate;
   (b) irradiating the photoresist layer in a pattern with actinic rays;
   (c) heating the photoresist layer after said irradiation with actinic rays, in atmosphere kept at a temperature in the range from 200° to 500° C. for a length of time not exceeding 10 minutes; and, after heating,
   (d) exposing the photoresist layer to an atmosphere of a plasma gas so as to decompose and remove the photoresist composition in the areas not irradiated with the actinic rays.

* * * * *